(12) United States Patent
Yamamoto (10) Patent No.: US 6,204,659 B1
(45) Date of Patent: Mar. 20, 2001

(54) INDUCTANCE CHANGE DETECTION CIRCUIT

(75) Inventor: Masahiro Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/196,137

(22) Filed: Nov. 20, 1998

(30) Foreign Application Priority Data

Jun. 24, 1998 (JP) .................................................. 10-177362

(51) Int. Cl.$^7$ ....................................................... G01B 7/14
(52) U.S. Cl. ................ 324/207.16; 324/207.19; 324/654
(58) Field of Search ...................... 324/207.16, 654, 324/656, 233, 207.26, 207.24, 207.19, 207.13, 234, 236

(56) References Cited

U.S. PATENT DOCUMENTS 4,626,621  12/1986  Hiyama et al. .

FOREIGN PATENT DOCUMENTS

| 43 13 273 | 10/1994 | (DE) . |
| 43 34 844 | 10/1994 | (DE) . |
| 195 21 531 | 12/1995 | (DE) . |

*Primary Examiner*—Christine Oda
*Assistant Examiner*—Anthony Jolly
(74) *Attorney, Agent, or Firm*—Oblon, Spivak, McClelland, Maier & Neustadt, P.C.

(57) ABSTRACT

An inductance change detection circuit for detecting a change in inductance with a simple circuit design, having a series circuit having a resistor and a coil of which an inductance changes according to a position of an object; a pulse power supply 1 for applying a pulse voltage to the series circuit; a first signal generator for generating a first signal when an output voltage of the resistor in the series circuit becomes a specific voltage level; a second signal generator for generating a second signal responsive to a pulse voltage of the pulse power supply; and a comparison pulse generator for generating a pulse signal having a duty ratio responsive to the coil inductance based on the first signal and second signal.

40 Claims, 7 Drawing Sheets

Fig.1

Fig. 3A Source pulse
Fig. 3B COout
Fig. 3C PCout (after inductance change)

Fig. 2A Source pulse
Fig. 2B COout
Fig. 2C PCout (initial state of inductance)

INDUCTANCE CHANGE DETECTION CIRCUIT

BACKGROUND OF THE INVENTION

1. Field of the Invention

The present invention relates to an inductance change detection circuit for detecting a change in the inductance of a coil. More specifically, the invention relates to an inductance change detection circuit for detecting a change in the position of an object based on a change in the inductance of a coil due to a change of a magnetic flux.

2. Description of the Related Art

A change in the position of an object that disrupts or indirectly changes the magnetic flux of a coil when the position of the object changes also results in a change in the inductance of the coil. It is therefore possible to detect a change in the object's position by detecting this inductance change as a DC signal, and devices used for this purpose are known from the literature. It is particularly desirable for such devices to detect this inductance change as a DC signal using a simple circuit design.

Figure 8A:
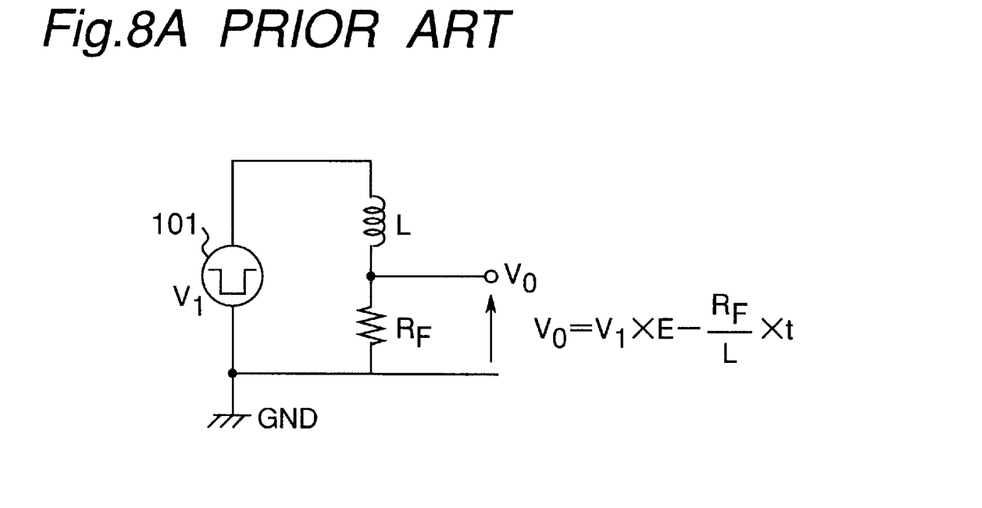
FIG. 8A is a circuit diagram and graph used to describe an inductance change detection circuit according to the prior art and FIG. 8B is a graph for showing the operation of the circuit shown in FIG. 8A.
Figure 8B:
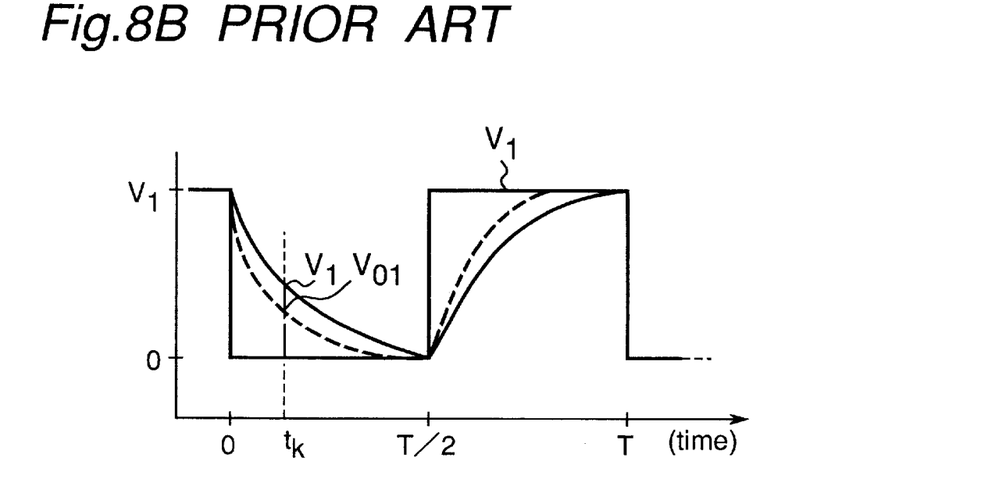

FIG. 8 shows a typical inductance change detection circuit according to the prior art as taught in Japanese Patent Laid-Open Publication No. 7-332910. FIG. 8A is a circuit diagram of this inductance change detection circuit, and FIG. 8B is a graph illustrating relationship between output pulses from a pulse power supply, and the output waveforms from a resistor $R_F$ in the inductance change detection circuit. Shown in FIG. 8A are a coil L of which the inductance changes according to the position of an object; a resistor $R_F$ having one end connected in series with the coil L and the other end to ground; and a pulse power supply 101.

The inductance change detection circuit shown in FIG. 8A detects the output from the output terminal, that is, the voltage between the resistor $R_F$ and ground, as an output voltage. When the position of the detected object has not changed from an initial position (referred to as the reference position below), this output voltage has a waveform as indicated by a solid line in FIG. 8B. When the position changes, however, the coil inductance L also changes, and the output voltage waveform changes as indicated by a dotted line in FIG. 8B. Because the output wave thus changes before and after the object changes position, it is possible to measure the voltage $V_0$ and $V_{01}$ at a specific time $t_k$, and to detect the inductance change from this voltage difference.

A typical inductance change detection circuit of this type, however, has difficulty in detecting an inductance change with good precision when the signal amplitude from the output terminal drops or varies, however, because the change in coil inductance is detected from output voltage values detected at specific discrete points in time.

There is therefore a need for an inductance change detection circuit whereby a change in coil inductance can be detected with good precision using a simple circuit configuration.

SUMMARY OF THE INVENTION

It is therefore an object of the present invention to provide a simple inductance change detection circuit for detecting a change in coil inductance with good precision.

It is a further object of the invention to provide an inductance change detection circuit for outputting the inductance change detection signal as a DC signal.

To achieve these objects, an inductance change detection circuit according to the present invention comprises: a series circuit element comprising a resistor and a coil of which an inductance changes according to a position of an object; a pulse power supply for applying a pulse voltage to the series circuit element; a first signal generating means for generating a first signal according to when an output voltage of the resistor in the series circuit element becomes a specific voltage level; a second signal generating means for generating a second signal according to a pulse voltage of the pulse power supply; and a comparison pulse generating means for generating a pulse signal having a duty ratio according to the coil inductance based on the first signal supplied from the first signal generating means and the second signal supplied from the second signal generating means.

In an inductance change detection circuit thus comprised, the second signal is preferably a pulse voltage from the pulse power supply, and the comparison pulse generating means is a phase comparator for comparing the phase of the first signal and the phase of the second signal.

Further preferably, the second signal generating means outputs a signal according to when an output voltage from the resistor of the series circuit element becomes a specific voltage, and the comparison pulse generating means is an operator for obtaining the exclusive OR of the first signal and second signal.

Alternatively, the signal generating means generate a signal according to the time an output voltage of the resistor in the series circuit element is between a first voltage level and a second voltage level.

In this case, the first and second voltage levels are preferably half the amplitude of the pulse voltage. The first and second voltage levels can also be different. Yet alternatively, the difference between the first voltage level and the low level of the pulse voltage, and the difference between the second voltage level and the high level of the pulse voltage, are the same.

Yet further alternatively, the signal generating means for generating a signal based on when the output voltage of the resistor in the series circuit element becomes a specific voltage is a comparator.

A yet further version of the inductance change detection circuit additionally comprises an integrator for integrating a pulse signal generated by the comparison pulse generating means, and converting the integrated pulse signal to a DC signal.

Any of the preceding inductance change detection circuits can yet further comprise a detection circuit connected to the series circuit element for detecting a resistance component of the coil. The inductance change detection circuit in this case detects displacement of an object by considering the detection result from the detection circuit.

The detection circuit can also measure a total voltage of the series circuit element and a voltage between the resistor and coil of the series circuit element. In this case, both measured voltage levels are integrated, and the resistance component of the coil is detected based on a difference between the integrated values.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:.

DETAILED DESCRIPTION OF THE PREFERRED EMBODIMENTS

The preferred embodiments of the present invention are described below with reference to the accompanying figures.

Embodiment 1

Figure 1:
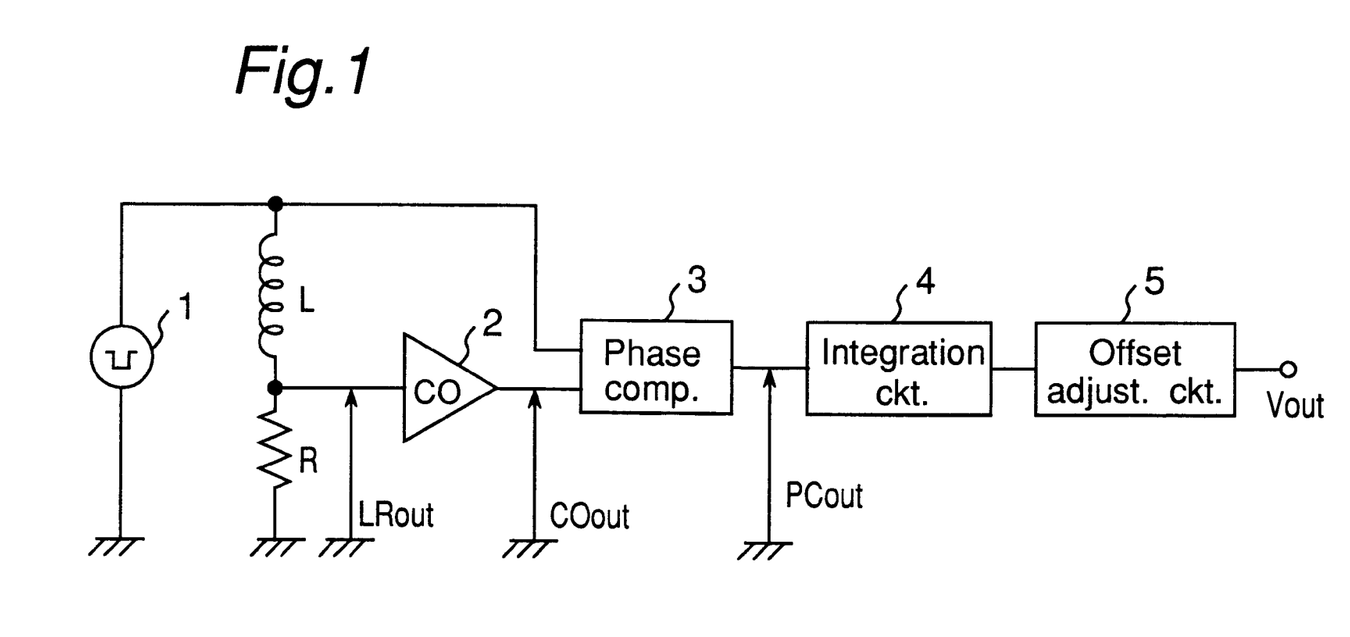
FIG. 1 is a block diagram of an inductance change detection circuit according to a first embodiment of the present invention.

FIG. 1 is a block diagram of an inductance change detection circuit according to a first embodiment of the present invention. A coil with inductance L is located near the object (not shown in the figures) of which the displacement is to be detected based on a change in the inductance L of the coil where the inductance changes according to the displacement of the object. A resistor R is provided with one end connected in series to the coil L and the other end to ground. An LR series circuit is thus formed by the series connected coil L and resistor R.

As shown in FIG. 1, this inductance change detection circuit also comprises a pulse power supply 1, comparator 2, phase comparator 3, integrator 4, and offset adjustment circuit 5.

The pulse power supply 1 is connected to the coil L at the terminal opposite the resistor R. The comparator 2 is connected to the LR series circuit on the side of the resistor R opposite the ground. The phase comparator 3 is connected to an output terminal of the comparator 2 and to the pulse power supply 1 to compare phases of an output of the comparator 2 and an output pulse from the pulse power supply 1. The integrator 4 integrates the output from the phase comparator 3 to output as a DC signal indicative of the phase comparator 3 output. The offset adjustment circuit 5 adjusts an offset for the output value of the integrator 4.

The operation of the inductance change detection circuit shown in FIG. 1 is described next.

Figure 2A:
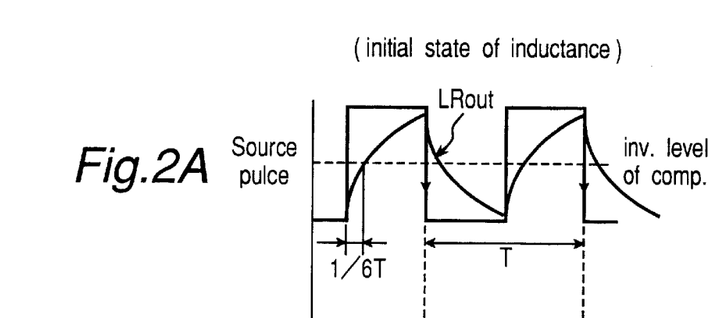
FIGS. 2A, 2B and 2C are graphs used to describe the initial state of the inductance change detection circuit shown in FIG. 1.
Figures 2B, 2C:
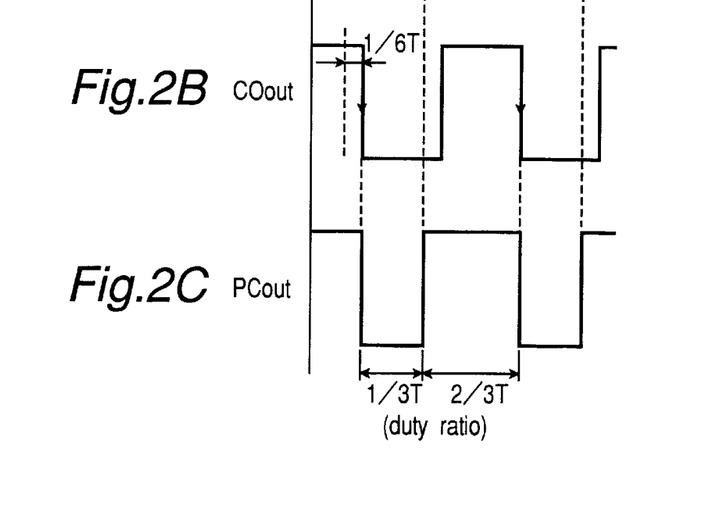

FIG. 2 is a graph showing waveforms of selected output signals in the inductance change detection circuit shown in FIG. 1 when the object of which the position is to be detected (referred to below as simply the object) is in a specific reference position, that is, when there is no change in coil inductance. FIG. 2A shows the relationship between the output pulse of the pulse power supply 1 and the output wave $LR_{out}$ detected from a terminal between the coil L and resistor R of the LR series circuit. FIG. 2B shows a waveform of an output $CO_{out}$ from the comparator 2. FIG. 2C shows an output $PC_{out}$ from the phase comparator 3.

The pulse power supply 1 outputs a rectangular pulse wave of period T, 50% duty ratio, and specific amplitude. When this pulse wave is applied to the LR series circuit, the voltage-divided output wave $LR_{out}$ from the LR series circuit has a time constant (R/L) that depends upon the inductance L of the coil L and resistance R as shown in FIG. 2A.

The output wave $LR_{out}$ of the LR series circuit is set to reach the inversion level of the comparator 2 at a particular time, for example, ⅙ T, after the rise of the output pulse from the pulse power supply 1 by adjusting the amplitude of the pulse power supply 1, the resistor R of the LR series circuit, and the inversion level of the comparator 2.

It should be noted that the inversion level of the comparator 2 is set to a level half the amplitude of the pulse power supply 1. As a result, the duty ratio of the output $CO_{out}$ from the comparator 2 can be set to 50%.

When the voltage-divided output wave $LR_{out}$ is input to the comparator 2, the output $CO_{out}$ of the comparator 2 goes from high to low when it reaches the inversion level, that is, at ⅙ T after the pulse output rise in this case. When the voltage-divided output wave $LR_{out}$ again reaches the inversion level, that is, at ⅙ T after the pulse output drop in this case, output $CO_{out}$ goes low to high. Thereafter, output $CO_{out}$ continues to switch between high and low each time the voltage-divided output wave $LR_{out}$ reaches the inversion level. In other words, the output $CO_{out}$ is a rectangular wave with the same period as the output pulse at a ⅓ T delay from the output of the pulse power supply 1 (has a 50% duty ratio).

When the output pulse from the pulse power supply 1 and the output $CO_{out}$ from the comparator 2 are supplied to the phase comparator 3, the output $PC_{out}$ from the phase comparator 3 is as shown in FIG. 2C. The phase of this output $CO_{out}$ is delayed ⅓ T from the phase of the pulse power supply 1 output pulse. As a result, the output $PC_{out}$ from the phase comparator 3 is a rectangular wave that is on for ⅔ T and off for ⅓ T (has a 67% duty ratio). The duty ratio of the output $PC_{out}$ of the phase comparator 3 when the object is in the reference position is therefore 67%.

The phase comparator output $PC_{out}$ is then converted by the integrator 4 to a DC signal indicative of the output $PC_{out}$. The offset adjustment circuit 5 then adjusts the DC signal to a specific level, ½$V_{cc}$ in the present embodiment, that is used as a reference output level.

Changes caused when the inductance of the coil L in the LR series circuit changes, and the voltage-divided output wave $LR_{out}$ time constant changes, are described next.

Figure 3A:
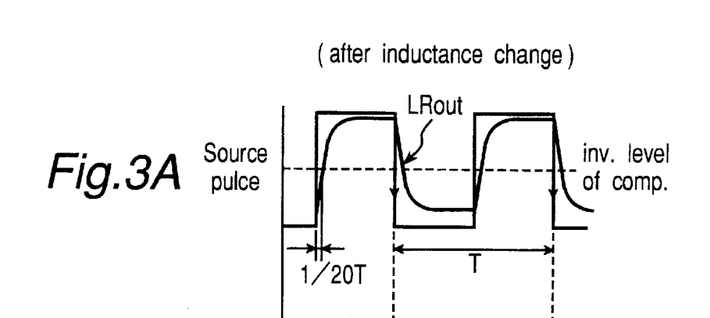
FIGS. 3A, 3B and 3C are graphs used to describe the detection operation of the inductance change detection circuit shown in FIG. 1.
Figures 3B, 3C:
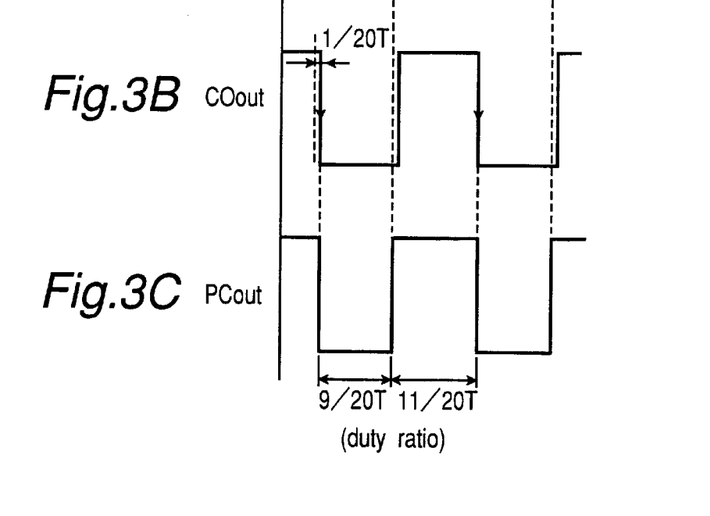

FIG. 3 shows the output signal waveforms in the inductance change detection circuit, when the object moved from the reference position and the inductance thus changed. FIG. 3A shows the relationship between the output pulse of the pulse power supply 1 and the output wave $LR_{out}$ detected from a terminal between the coil L and resistor R of the LR series circuit. FIG. 3B shows a waveform of the output $CO_{out}$ from the comparator 2. FIG. 3C shows an output $PC_{out}$ from the phase comparator 3.

When the inductance of the coil L changes to a level less than that at the reference position, for example, the rise in the voltage-divided output wave $LR_{out}$ is steeper than in the reference position. The voltage-divided output wave $LR_{out}$ thus reaches the inversion level more quickly, that is, at 1/20

T from the rise in the output pulse of the pulse power supply 1 in this example.

As shown in FIG. 3B, the output $CO_{out}$ of the comparator 2 inverts at $\frac{1}{20}$ T from the rise in the output pulse of the pulse power supply, and thereafter continues to invert every $\frac{1}{2}$ T. More specifically, the comparator output $CO_{out}$ is a rectangular wave with the same period as the output pulse at a $\frac{9}{20}$ T delay from the output of the pulse power supply 1 (has a 50% duty ratio).

When the output pulse from the pulse power supply 1 and the output $CO_{out}$ from the comparator 2 are supplied to the phase comparator 3, the output $PC_{out}$ from the phase comparator 3 is as shown in FIG. 3C. As a result, the output $PC_{out}$ from the phase comparator 3 is a rectangular wave that is on for $\frac{11}{20}$ T and off for $\frac{9}{20}$ T (has a 55% duty ratio). The duty ratio of the output $PC_{out}$ of the phase comparator 3 when the object has moved from the reference position and the inductance has therefore changed is thus 55%.

The phase comparator output $PC_{out}$ is then converted by the integrator 4 to a DC signal as described above. The resulting DC signal level in this case is lower than that in the reference position, however, because the duty ratio has dropped from 67% to 55%. If the DC signal level is $\frac{1}{2}Vcc$ in the reference position, and the drop in the DC signal level when the inductance changes as a result of the object position changing is $\alpha$, the output $V_{out}$ from the inductance change detection circuit is ($\frac{1}{2}Vcc-\alpha$), and the change in the inductance of the coil L can be detected as a DC signal of $-\alpha$.

It should be noted that if the coil inductance rises compared with that in the reference position, the rise in the voltage-divided output wave $LR_{out}$ will be gradual compared with the reference position. It will therefore also take more time from the rise in the output pulse of the pulse power supply 1 for the voltage-divided output wave $LR_{out}$ to reach the inversion level of the comparator 2. The duty ratio of the output $PC_{out}$ from the phase comparator 3 will therefore also be greater than that in the reference position, and the DC signal level from the integrator 4 will be greater. For example, if $\beta$ is the rise in the inductance level, the output $V_{out}$ from the inductance change detection circuit will be ($\frac{1}{2}Vcc+\beta$). It is therefore possible to determine whether the inductance has increased or decreased by detecting whether the DC signal level from the integrator 4 is greater than or less than the reference position signal level.

It will be obvious to one of ordinary skill in the art that while the inversion level of the comparator is set to half the amplitude of the output pulse from the pulse power supply 1 in the present embodiment, the invention shall not be so limited. More specifically, this inversion level can be any known level below the maximum amplitude of the voltage-divided output wave $LR_{out}$. However, when the inversion level is not half the amplitude of the output pulse, the duty ratio of the output $CO_{out}$ from the comparator 2 will not be 50%.

As described above, the output pulse from the pulse power supply 1 and the output $CO_{out}$ from the comparator are phase compared, and the inductance change is detected based on the duty ratio of the resulting output. As a result, the inductance change can be precisely detected even when the signal amplitude from the output terminal drops. Furthermore, by converting the phase comparator output to a DC signal using an integrator, an inductance change can be detected with a simple circuit configuration, and the resulting detection signal can be output as a DC signal.

Embodiment 2

Figure 4:
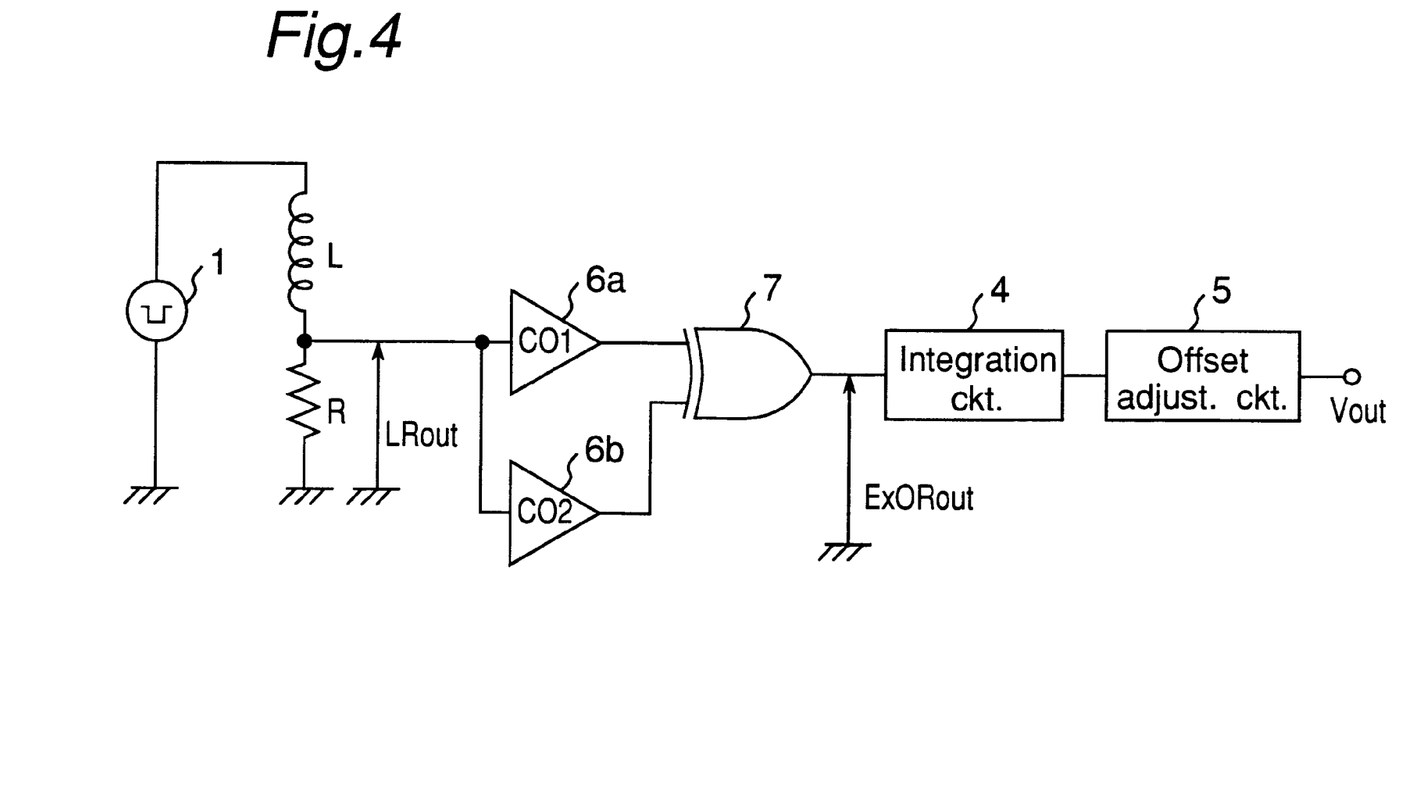
FIG. 4 is a block diagram of an inductance change detection circuit according to a second embodiment of the present invention.

FIG. 4 is a block diagram of an inductance change detection circuit according to a second embodiment of the present invention. As shown in the figure, this inductance change detection circuit comprises a first comparator CO1 6a, a second comparator CO2 6b, an operator 7, an integrator 4 and a offset adjustment circuit 5. Note that both comparators 6a and 6b are connected to the LR series circuit on the side of the resistor R opposite the ground. The operator 7 takes the exclusive OR of the outputs from the two comparators 6a and 6b, and outputs to the integrator 4. The integrator 4 and offset adjustment circuit 5 operate as in the first embodiment above.

The operation of the inductance change detection circuit shown in FIG. 4 is described next.

FIG. 5 is a graph showing waveforms of selected output signals in the inductance change detection circuit shown in FIG. 4 when the object of which the position is to be detected is in a specific reference position, that is, when there is no change in coil inductance. FIG. 5A shows the relationship between the output pulse of the pulse power supply 1 and the output wave $LR_{out}$ detected from a terminal between the coil L and resistor R of the LR series circuit. FIG. 5B shows a waveform of the output $CO1_{out}$ from the first comparator 6a. FIG. 5C shows an output $CO2_{out}$ from the second comparator 6b. FIG. 5D shows an output $ExOR_{out}$ of the operator 7.

Figure 5A:
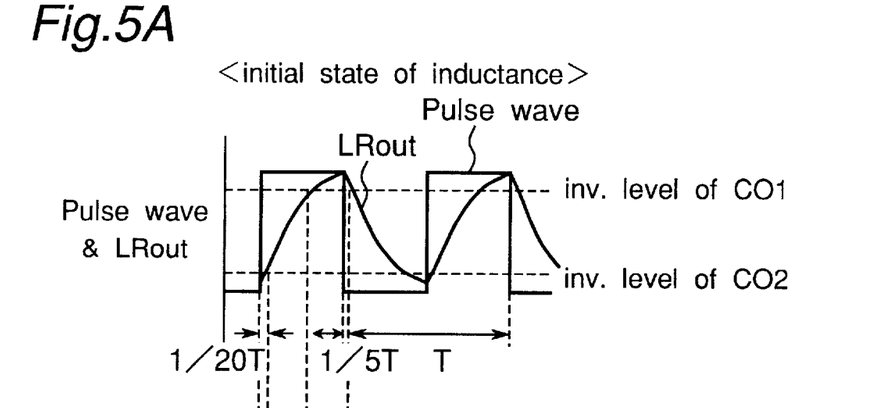
FIGS. 5A, 5B, 5C, and 5D are graphs used to describe the initial state of the inductance change detection circuit shown in FIG. 4.

The pulse power supply 1 outputs a rectangular pulse wave of period T, 50% duty ratio, and specific amplitude. When this pulse wave is applied to the LR series circuit, the voltage-divided output wave $LR_{out}$ from the LR series circuit has a time constant (R/L) that depends upon the inductance L of the coil and resistance R, as shown in FIG. 5A.

By adjusting the amplitude of the pulse power supply 1, the resistor R of the LR series circuit, and the inversion levels of the window comparators 6a and 6b where T is the period of the pulse power supply 1 and the duty ratio is 50%, the output wave $LR_{out}$ of the LR series circuit is set to reach the inversion level of the second comparator 6b at a particular time, for example, $\frac{1}{20}$ T, after the rise of the output pulse from the pulse power supply 1, and reach the inversion level of the first comparator 6a at $\frac{9}{20}$ T, for example.

Note that the inversion levels of the comparators 6a and 6b are different. More specifically, the comparator inversion levels are adjusted in the present embodiment such that the inversion level of the first comparator 6a is higher than the inversion level of the other comparator 6b, and the difference between the inversion level of the second comparator 6b and the low level output pulse of the pulse power supply 1, and the difference between the inversion level of the first comparator 6a and the high level output pulse of the pulse power supply 1, are the same.

By thus setting the inversion levels of the comparators, the duty ratio of the output $ExOR_{out}$ from the operator 7 can be adjusted to 50%.

Figure 5B:
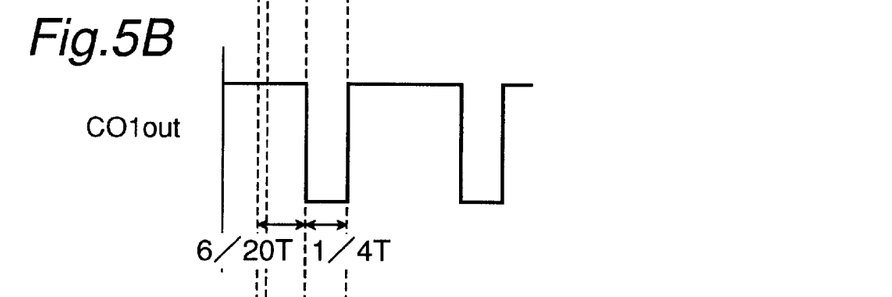

When the voltage-divided output wave $LR_{out}$ is then input to the first comparator 6a (CO1), the comparator output $CO1_{out}$ goes low from high when the voltage-divided output wave $LR_{out}$ reaches the inversion level (at $\frac{9}{20}$ T from the pulse output rise in this example), and then goes high from low when the voltage-divided output wave $LR_{out}$ next returns to the inversion level (at $\frac{1}{20}$ T after the pulse output drop) as shown in FIG. 5B. Thereafter, the output $CO1_{out}$ continues to go low from high, or high from low, each time the voltage-divided output wave $LR_{out}$ reaches the comparator 6a (CO1) inversion level.

Figure 5C:
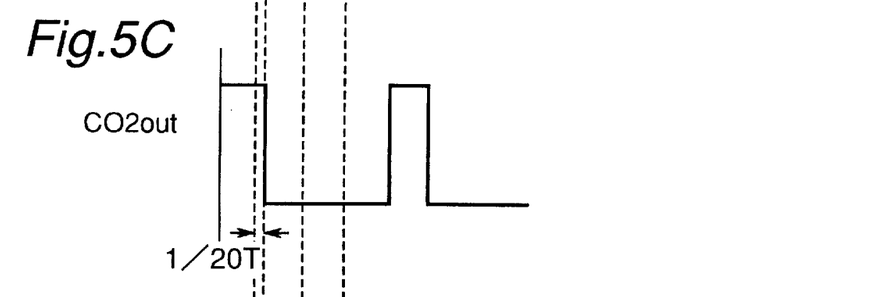

When the voltage-divided output wave $LR_{out}$ is input to the second comparator 6b (CO2), the comparator output $CO2_{out}$ likewise goes low from high when the voltage-divided output wave $LR_{out}$ reaches the inversion level (at 1/20 T from the pulse output rise in this example), and then goes high from low when the voltage-divided output wave $LR_{out}$ next returns to the inversion level (at 9/20 T after the pulse output drop) as shown in FIG. 5C. Thereafter, the output $CO2_{out}$ continues to go low from high, or high from low, each time the voltage-divided output wave $LR_{out}$ reaches the comparator 6b (CO2) inversion level.

Figure 5D:
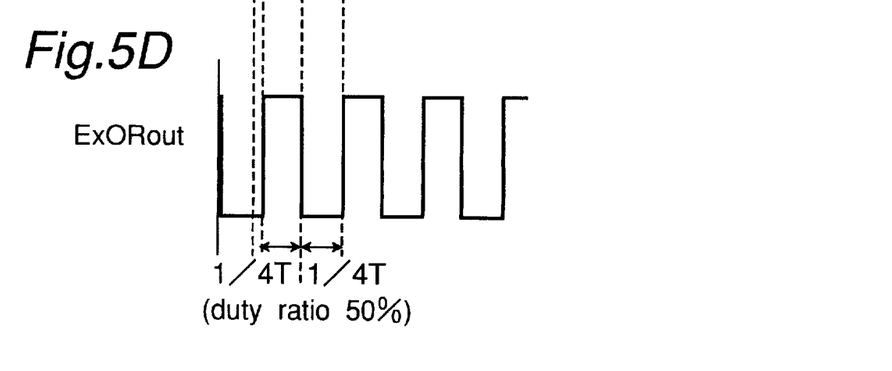

The operator 7 then obtains the exclusive OR of the comparator output signals output $CO1_{out}$ and output $CO2_{out}$, and outputs output $ExOR_{out}$. As shown in FIG. 5D, the output $ExOR_{out}$ is high for the period 1/20 T to 9/20 T after the pulse output rise, is low for the period 9/20 T to 11/20 T, and thereafter switches high and low every 1/4 T. As a result, the output $ExOR_{out}$ of the operator 7 in the reference position has a period of 1/2 T and a duty ratio of 50%.

As in the first embodiment, the integrator 4 and offset adjustment circuit 5 convert the output $ExOR_{out}$ from the operator 7 to a DC signal, and adjust the DC signal to, for example, 1/2Vcc.

Changes caused when the inductance of the coil L in the LR series circuit changes, and the voltage-divided output wave $LR_{out}$ time constant changes, are described next. It is assumed in the following example that the voltage-divided output wave $LR_{out}$ reaches the inversion level of the second comparator 6b (CO2) at 1/40 T after the rise in the output pulse of the pulse power supply 1, and at 3/40 T reaches the inversion level of the first comparator 6a (CO1).

FIG. 6 shows the output signal waveforms in the inductance change detection circuit at this time, that is, when the object position changed from the reference position and, accordingly, the inductance changed. FIG. 6A shows the relationship between the output pulse of the pulse power supply 1 and the output wave $LR_{out}$ detected from a terminal between the coil L and resistor R of the LR series circuit. FIG. 6B shows a waveform of the output $CO1_{out}$ from the comparator 6a. FIG. 6C shows an output $CO2_{out}$ from the other comparator 6b. FIG. 6D shows an output $ExOR_{out}$ from the operator 7.

Figure 6A:
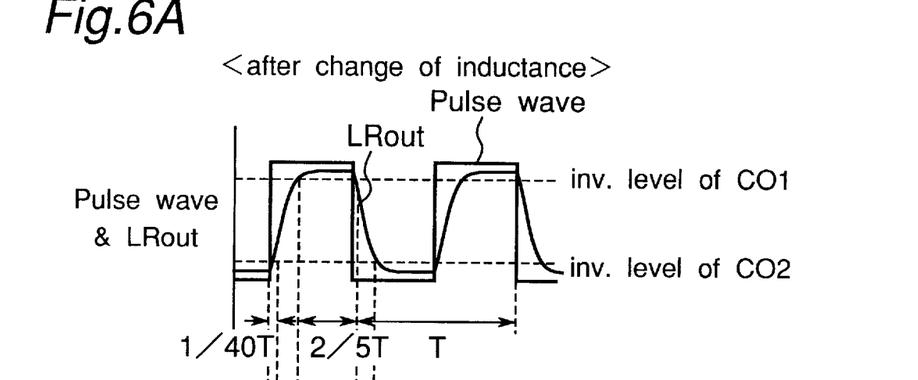
FIGS. 6A, 6B, 6C and 6D are graphs used to describe the detection operation of the inductance change detection circuit shown in FIG. 4.
Figure 6B:
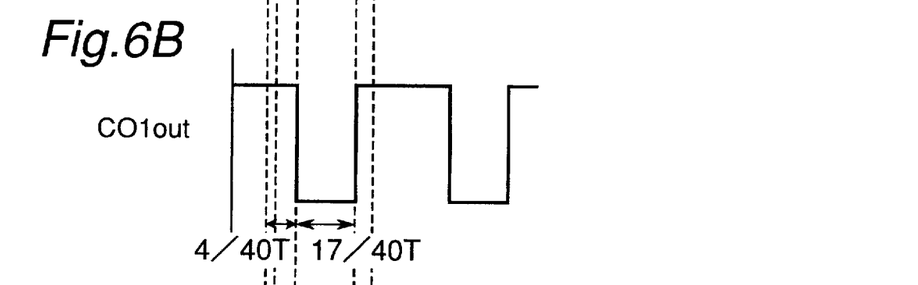

When the voltage-divided output wave $LR_{out}$ is input to the first comparator 6a (CO1), the comparator output $CO1_{out}$ goes low from high when the voltage-divided output wave $LR_{out}$ reaches the inversion level (at 3/40 T from the pulse output rise in this example), and then goes high from low when the voltage-divided output wave $LR_{out}$ next returns to the inversion level (at 1/40 T after the pulse output drop). Thereafter, the output $CO1_{out}$ continues to go low from high, or high from low, each time the voltage-divided output wave $LR_{out}$ reaches the comparator 6a (CO1) inversion level.

Figure 6C:
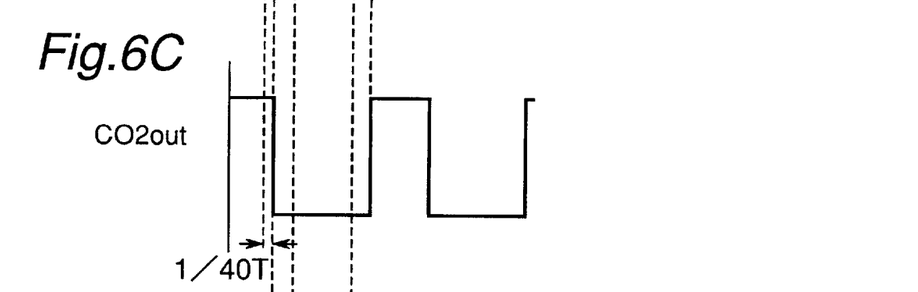
Figure 6D:
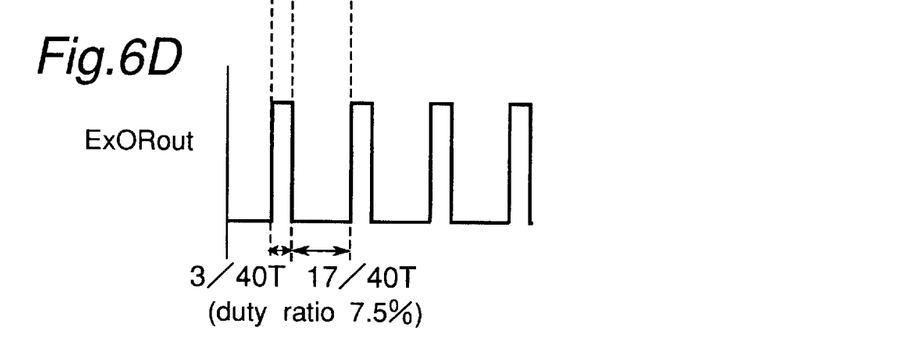

When the voltage-divided output wave $LR_{out}$ is input to the second comparator 6b (CO2), the comparator output $CO2_{out}$ likewise goes low from high when the voltage-divided output wave $LR_{out}$ reaches the inversion level (at 1/40 T from the pulse output rise in this example), and then goes high from low when the voltage-divided output wave $LR_{out}$ next returns to the inversion level (at 4/40 T after the pulse output drop) as shown in FIG. 6C. Thereafter, the output $CO2_{out}$ continues to go low from high, or high from low, each time the voltage-divided output wave $LR_{out}$ reaches the comparator 6b (CO2) inversion level.

Figure 7:
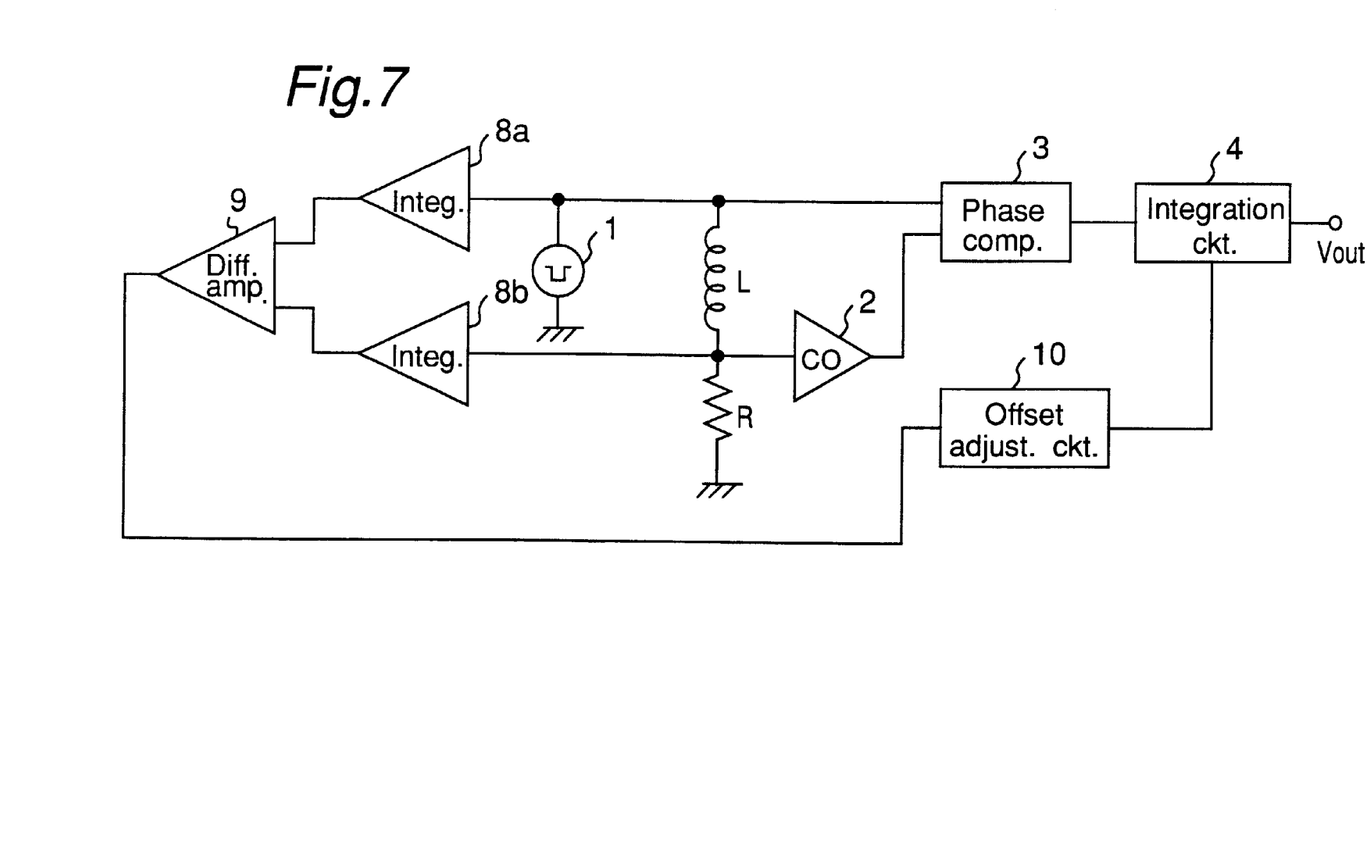
FIG. 7 is a block diagram of an inductance change detection circuit according to a third embodiment of the present invention.

The operator 7 then obtains the exclusive OR of the comparator output signals output $CO1_{out}$ and output $CO2_{out}$, and outputs output $ExOR_{out}$. As shown in FIG. 7D, the output $ExOR_{out}$ is high for the period 1/40 T to 4/40 T after the pulse output rise, is low for the period 4/40 T to 21/40 T, and thereafter continues to go high after 3/40 T and low again after 17/40 T. As a result, the output $ExOR_{out}$ of the operator 7 when the coil inductance changes has a period of 1/2 T and a duty ratio of 7.5%.

As at the reference position, the integrator 4 and offset adjustment circuit 5 convert the output $ExOR_{out}$ from the operator 7 to a DC signal. In this case, however, the DC signal level is low compared with the signal level in the reference position because the duty ratio has dropped from 50% to 7.5%.

If the DC signal level is 1/2Vcc in the reference position, and the drop in the DC signal level when the inductance changes as a result of the object position changing is γ, the output $V_{out}$ from the inductance change detection circuit is (1/2Vcc−γ), and the change in the inductance of the coil L can be detected as a DC signal of −γ.

As in the first embodiment, it is therefore possible to determine whether the inductance has increased or decreased by detecting whether the DC signal level from the integrator 4 is greater than or less than the reference position signal level.

It will also be obvious to one with ordinary skill in the related art that while the difference between the amplitude of the pulse power supply output pulse and the inversion level of the first comparator 6a (CO1), and the inversion level of the second comparator 6b (CO2), are the same in the present embodiment, the present invention shall not be so limited. More specifically, it is sufficient if the inversion level of the both comparators CO1 and CO2 is between the minimum and maximum levels of the voltage-divided output wave $LR_{out}$. In this case, however, the duty ratio of the output $ExOR_{out}$ from the operator 7 in the reference position will not necessarily be 50%.

As will be known from the above description, an inductance change is detected based on the duty ratio of the output result obtained when the voltage-divided output wave $LR_{out}$ of the output terminal is between particular voltage levels. In addition to the effects achieved with the first embodiment of the present invention, it is therefore also possible to detect a change in the coil inductance according to the time the voltage-divided output wave $LR_{out}$ at the output terminal is between selected voltage levels, and a change in inductance can therefore be detected with even greater precision.

Embodiment 3

In an inductance change detection circuit according to the above first and second embodiments, the internal resistance of the coil in the LR series circuit has a high temperature dependency. As a result, changes in temperature can result in temperature drift of the voltage-divided output wave $LR_{out}$, and, therefore, the final output $V_{out}$. In addition, the output $V_{out}$ tends to vary under either low or high temperature conditions even though there is no change in the inductance of the coil L.

An inductance change detection circuit according to this third embodiment of the invention therefore provides a compensation circuit for correcting temperature-induced variations in the coil resistance R1 of the LR series circuit. Due to this compensation circuit, the output $V_{out}$ is prevented from changing when the inductance of the coil L does not change even if there is a change in temperature.

FIG. 7 is a block diagram of an inductance change detection circuit according to this third embodiment. As shown in FIG. 7, this inductance change detection circuit comprises two integrators 8a and 8b. One integrator 8a is connected to the output terminal of the pulse power supply 1 and integrates the power supply output. The other integrator 8b is connected to a terminal between the coil L and resistor R of the LR series circuit on the side of the resistor R opposite the ground for integrating the voltage-divided output wave $LR_{out}$. A differential amplifier 9 obtains the difference between the outputs from the integrators 8a and 8b, and amplifies the resulting difference signal. The offset adjustment circuit 10 adjusts the output from the differential amplifier 9, and supplies the offset result to the integrator 4. The other components are as in the preceding embodiments, and further description thereof is therefore omitted below.

The operation of this inductance change detection circuit is described next. Note that the operation of all components other than the integrators 8a and 8b, differential amplifier 9, offset adjustment circuit 10, and integrator 4 is as in the first embodiment above, and further description thereof is therefore omitted below.

The total voltage of the LR series circuit is integrated by the integrator 8a and converted to a DC signal. The voltage applied to the resistor R of the LR series circuit is integrated by the other integrator 8b and similarly converted to a DC signal. The DC signals from the two integrators 8a and 8b are supplied to the differential amplifier 9, which calculates the difference therebetween. The amplification factor of the differential amplifier 9 is appropriately adjusted so that the resulting difference signal is amplified to a desired level before being output from the differential amplifier 9.

By thus determining the difference between the voltage applied to the entire LR series circuit and the voltage applied to just the resistor R in the LR series circuit as a DC signal, the DC component acting on the coil L can be determined. That is, the internal resistance R1 of the coil L can be detected.

The amplified difference signal is then applied to the offset adjustment circuit 10. The offset adjustment circuit 10 compensates the value of the internal resistance R1 of the coil L, and the integrator 4 converts the output from the phase comparator 3 to a DC signal.

It should be noted that while the inductance change detection circuit according to the present embodiment is described as addressing the temperature drift problem found in an inductance change detection circuit according to the first embodiment of the invention, it shall not be specifically limited thereto. That is, the inductance change detection circuit according to the present version of the invention can also be applied to an inductance change detection circuit according to the second embodiment above.

By thus comprising a compensation circuit for correcting inductance detection error resulting from temperature-induced changes in the coil resistance R1 of the LR series circuit, an inductance change detection circuit according to the present embodiment can detect changes in inductance without being affected by changes in the internal resistance of the coil L resulting from changes in temperature.

As described above, an inductance change detection circuit according to a first preferred version of the present invention comprises a series circuit element comprising a resistor and a coil of which an inductance changes according to a position of an object; a pulse power supply for applying a pulse voltage to the series circuit element; a first signal generating means for generating a first signal according to when an output voltage of the resistor in the series circuit element becomes a specific voltage level; a second signal generating means for generating a second signal according to a pulse voltage of the pulse power supply; and a comparison pulse generating means for generating a pulse signal having a duty ratio according to the coil inductance based on the first signal supplied from the first signal generating means and the second signal supplied from the second signal generating means. As a result, it can detect an inductance change with good precision even when the amplitude of a signal obtained from the output terminal drops.

The second signal is preferably a pulse voltage from the pulse power supply; and the comparison pulse generating means is preferably a phase comparator for comparing the phase of the first signal and the phase of the second signal. In this case, a pulse signal can be generated according to the output voltage of the resistor in the series circuit element.

Yet further preferably, the second signal generating means outputs a signal according to when an output voltage from the resistor of the series circuit element becomes a specific voltage; and the comparison pulse generating means is an operator for obtaining the exclusive OR of the first signal and second signal. In this case, a pulse signal can be generated according to the output voltage of the resistor in the series circuit element between known voltage levels.

In addition, when the signal generating means generate signals according to the time an output voltage of the resistor in the series circuit element is between a first voltage level and a second voltage level, a pulse signal can be easily generated.

Furthermore, when the first and second voltage levels are half the amplitude of the pulse voltage, the duty ratio of a signal from the signal generating means can be controlled to 50%.

Yet further, when the first and second voltage levels are different, detection according to how long the output voltage of the resistor in the series circuit element is between desired voltage levels is possible. As a result, an inductance change can be detected more accurately.

Yet further, when the difference between the first voltage level and the low level of the pulse voltage, and the difference between the second voltage level and the high level of the pulse voltage, are the same, the duty ratio of the pulse signal output from the comparison pulse generating means can be controlled to 50%.

In addition, when the signal generating means for generating a signal based on when the output voltage of the resistor in the series circuit element becomes a specific voltage is a comparator, a signal can be generated according to when a certain voltage level is reached using a simple circuit design.

The inductance change detection circuit according to the present invention further preferably comprises an integrator for integrating a pulse signal generated by the comparison pulse generating means, and converting the integrated pulse signal to a DC signal. In this case, an inductance change can be detected by a simple circuit configuration, and the detection signal can be output as a DC signal.

Yet further preferably, the inductance change detection circuit of the present invention comprises a detection circuit connected to the series circuit element for detecting a resistance component of the coil, and the inductance change detection circuit detects displacement of an object by considering the detection result from the detection circuit. In this case, an inductance change can be detected without being affected by a change in the internal resistance of the coil resulting from a change in temperature.

Yet further preferably, the detection circuit measures a total voltage of the series circuit element and a voltage between the resistor and coil of the series circuit element. Both measured voltage levels are then integrated, and the resistance component of the coil is detected based on a difference between the integrated values. In this case, the change in the internal resistance of the coil resulting from, for example, a temperature change, can be detected as a DC signal.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. An inductance change detection circuit, comprising:
   a series circuit comprising a resistor and a coil of which an inductance changes according to a position of an object to be detected;
   a pulse power supply for applying a pulse voltage to said series circuit;
   a first signal generating means for generating a first signal when an output voltage of the resistor in said series circuit becomes a specific voltage level;
   a second signal generating means for generating a second signal responsive to the pulse voltage of said pulse power supply; and
   a comparison pulse generating means for generating a pulse signal having a duty ratio responsive to the coil inductance based on the first signal supplied from said first signal generating means and the second signal supplied from said second signal generating means,
   wherein the first and second signals have a same period.

2. The inductance change detection circuit as set forth in claim 1, wherein:
   the second signal is a pulse voltage from said pulse power supply, and
   said comparison pulse generating means is a phase comparator for comparing the phase of the first signal and the phase of the second signal.

3. The inductance change detection circuit as set forth in claim 1, wherein:
   said second signal generating means outputs the second signal when an output voltage from the resistor of said series circuit becomes a specific voltage, and
   said comparison pulse generating means is an operator for obtaining the exclusive OR of the first signal and second signal.

4. The inductance change detection circuit as set forth in claim 1, wherein said first signal generating means generates the first signal at a timing between a time when the output voltage of said resistor becomes a first predefined voltage level and a time when the output voltage becomes a second predefined voltage level.

5. The inductance change detection circuit as set forth in claim 4, wherein the first and second voltage levels are half the amplitude of the pulse voltage, respectively.

6. The inductance change detection circuit as set forth in claim 4, wherein the first and second voltage levels are different.

7. The inductance change detection circuit as set forth in claim 6, wherein the difference between the first voltage level and the low level of the pulse voltage, and the difference between the second voltage level and the high level of the pulse voltage, are the same.

8. The inductance change detection circuit as set forth in claim 1, wherein said first and second signal generating means are a comparator, respectively.

9. The inductance change detection circuit as set forth in claim 1, further comprising an integrator for integrating the pulse signal generated by said comparison pulse generating means, and converting the integrated pulse signal to a DC signal.

10. The inductance change detection circuit as set forth in claim 1, further comprising a detection circuit connected to said series circuit for detecting a resistance component of said coil, and detecting displacement of the object based on results obtained by said detection circuit.

11. The inductance change detection circuit as set forth in claim 10, wherein said detection circuit measures a total voltage of said series circuit and a voltage between said resistor and coil of said series circuit,
   both measured voltage levels are integrated, and
   the resistance component of said coil is detected based on a difference between the integrated values.

12. An inductance change detection circuit, comprising:
   a series circuit comprising a resistor and a coil of which an inductance changes according to a position of an object to be detected;
   a pulse power supply configured to apply a pulse voltage to said series circuit;
   a first signal generator configured to generate a first signal when an output voltage of the resistor in said series circuit becomes a specific voltage level;
   a second signal generator configured to generate a second signal responsive to the pulse voltage of said pulse power supply; and
   a comparison pulse generator configured to generate a pulse signal having a duty ratio responsive to the coil inductance based on the first signal supplied from said first signal generator and the second signal supplied from said second signal generator,
   wherein the first and second signals have a same period.

13. The inductance change detection circuit as set forth in claim 12, wherein:
   the second signal is a pulse voltage from said pulse power supply, and
   said comparison pulse generator is a phase comparator configured to compare the phase of the first signal and the phase of the second signal.

14. The inductance change detection circuit as set forth in claim 12, wherein:
   said second signal generator outputs the second signal when an output voltage from the resistor of said series circuit becomes a specific voltage, and
   said comparison pulse generator is an operator configured to obtain the exclusive OR of the first signal and second signal.

15. The inductance change detection circuit as set forth in claim 12, wherein said first signal generator generates the first signal at a timing between a time when the output voltage of said resistor becomes a first predefined voltage level and a time when the output voltage becomes a second predefined voltage level.

16. The inductance change detection circuit as set forth in claim 15, wherein the first and second voltage levels are half the amplitude of the pulse voltage, respectively.

17. The inductance change detection circuit as set forth in claim 15, wherein the first and second voltage levels are different.

18. The inductance change detection circuit as set forth in claim 17, wherein the difference between the first voltage level and the low level of the pulse voltage, and the difference between the second voltage level and the high level of the pulse voltage, are the same.

19. The inductance change detection circuit as set forth in claim 12, wherein said first and second signal generators are comparators, respectively.

20. The inductance change detection circuit as set forth in claim 12, further comprising an integrator configured to integrate the pulse signal generated by said comparison pulse generator, and to convert the integrated pulse signal to a DC signal.

21. The inductance change detection circuit as set forth in claim 12, further comprising a detection circuit connected to said series circuit and configured to detect a resistance component of said coil, and to detect a displacement of the object based on results obtained by said detection circuit.

22. The inductance change detection circuit as set forth in claim 21, wherein:
said detection circuit measures a total voltage of said series circuit and a voltage between said resistor and coil of said series circuit,
both measured voltage levels are integrated, and
the resistance component of said coil is detected based on a difference between the integrated values.

23. An inductance change detection circuit, comprising:
a series circuit comprising a resistor and a coil of which an inductance changes according to a position of an object to be detected;
a pulse power supply for applying a pulse voltage to said series circuit;
a first signal generating means for generating a first signal when an output voltage of the resistor in said series circuit becomes a specific voltage level;
a second signal generating means for generating a second signal responsive to the pulse voltage of said pulse power supply; and
a comparison pulse generating means for generating a pulse signal having a duty ratio responsive to the coil inductance based on the first signal supplied from said first signal generating means and the second signal supplied from said second signal generating means,
wherein said first signal generating means generates the first signal at a timing between a time when the output voltage of said resistor becomes a first predefined voltage level and a time when the output voltage becomes a second predefined voltage level, and
wherein the first and second voltage levels are half the amplitude of the pulse voltage, respectively.

24. The inductance change detection circuit as set forth in claim 23, wherein:
the second signal is a pulse voltage from said pulse power supply, and
said comparison pulse generating means is a phase comparator for comparing the phase of the first signal and the phase of the second signal.

25. The inductance change detection circuit as set forth in claim 23, wherein:
said second signal generating means outputs the second signal when an output voltage from the resistor of said series circuit becomes a specific voltage, and
said comparison pulse generating means is an operator for obtaining the exclusive OR of the first signal and second signal.

26. The inductance change detection circuit as set forth in claim 23, wherein the first and second voltage levels are different.

27. The inductance change detection circuit as set forth in claim 26, wherein the difference between the first voltage level and the low level of the pulse voltage, and the difference between the second voltage level and the high level of the pulse voltage, are the same.

28. The inductance change detection circuit as set forth in claim 23, wherein said first and second signal generating means are a comparator, respectively.

29. The inductance change detection circuit as set forth in claim 23, further comprising an integrator for integrating the pulse signal generated by said comparison pulse generating means, and for converting the integrated pulse signal to a DC signal.

30. The inductance change detection circuit as set forth in claim 23, further comprising a detection circuit connected to said series circuit for detecting a resistance component of said coil, and for detecting a displacement of the object based on results obtained by said detection circuit.

31. The inductance change detection circuit as set forth in claim 30, wherein:
said detection circuit measures a total voltage of said series circuit and a voltage between said resistor and coil of said series circuit,
both measured voltage levels are integrated, and
the resistance component of said coil is detected based on a difference between the integrated values.

32. An inductance change detection circuit, comprising:
a series circuit comprising a resistor and a coil of which an inductance changes according to a position of an object to be detected;
a pulse power supply configured to apply a pulse voltage to said series circuit;
a first signal generator configured to generate a first signal when an output voltage of the resistor in said series circuit becomes a specific voltage level;
a second signal generator configured to generate a second signal responsive to the pulse voltage of said pulse power supply; and
a comparison pulse generator configured to generate a pulse signal having a duty ratio responsive to the coil inductance based on the first signal supplied from said first signal generator and the second signal supplied from said second signal generator,
wherein said first signal generator generates the first signal at a timing between a time when the output voltage of said resistor becomes a first predefined voltage level and a time when the output voltage becomes a second predefined voltage level, and
wherein the first and second voltage levels are half the amplitude of the pulse voltage, respectively.

33. The inductance change detection circuit as set forth in claim 32, wherein:
the second signal is a pulse voltage from said pulse power supply, and
said comparison pulse generator is a phase comparator configured to compare the phase of the first signal and the phase of the second signal.

34. The inductance change detection circuit as set forth in claim 32, wherein:
said second signal generator outputs the second signal when an output voltage from the resistor of said series circuit element becomes a specific voltage, and
said comparison pulse generator is an operator configured to obtain the exclusive OR of the first signal and second signal.

35. The inductance change detection circuit as set forth in claim 32, wherein the first and second voltage levels are different.

36. The inductance change detection circuit as set forth in claim 34, wherein the difference between the first voltage level and the low level of the pulse voltage, and the difference between the second voltage level and the high level of the pulse voltage, are the same.

37. The inductance change detection circuit as set forth in claim 32, wherein said first and second signal generators are comparators, respectively.

38. The inductance change detection circuit as set forth in claim 32, further comprising an integrator configured to integrate the pulse signal generated by said comparison pulse generator, and to convert the integrated pulse signal to a DC signal.

39. The inductance change detection circuit as set forth in claim 32, further comprising a detection circuit connected to said series circuit and configured to detect a resistance component of said coil, and to detect a displacement of the object based on results obtained by said detection circuit.

40. The inductance change detection circuit as set forth in claim 39, wherein:

said detection circuit measures a total voltage of said series circuit and a voltage between said resistor and coil of said series circuit, both measured voltage levels are integrated, and the resistance component of said coil is detected based on a difference between the integrated values.

* * * * *